United States Patent
Buhmann et al.

(10) Patent No.: US 8,775,491 B2
(45) Date of Patent: Jul. 8, 2014

(54) METHOD AND APPARATUS FOR REDUCING SIGNAL EDGE JITTER IN AN OUTPUT SIGNAL FROM A NUMERICALLY CONTROLLED OSCILLATOR

(75) Inventors: Alexander Buhmann, Reutlingen (DE); Marian Keck, Leonberg (DE)

(73) Assignee: Robert Bosch GmbH, Stuttgart (DE)

( * ) Notice: Subject to any disclaimer, the term of this patent is extended or adjusted under 35 U.S.C. 154(b) by 155 days.

(21) Appl. No.: 13/367,834

(22) Filed: Feb. 7, 2012

(65) Prior Publication Data
US 2012/0200326 A1  Aug. 9, 2012

(30) Foreign Application Priority Data
Feb. 8, 2011 (DE) .......................... 10 2011 003 738

(51) Int. Cl.
*G06F 1/02* (2006.01)
*G06F 1/03* (2006.01)

(52) U.S. Cl.
CPC ............ *G06F 1/0342* (2013.01); *G06F 1/0328* (2013.01); *G06F 1/022* (2013.01)
USPC ........... 708/271; 327/105; 327/141; 327/107; 331/175

(58) Field of Classification Search
USPC ....... 331/175, 1 A, 34, DIG. 3; 327/105, 107, 327/141, 142, 144, 147, 150, 156, 159; 375/376; 708/271
See application file for complete search history.

(56) References Cited

U.S. PATENT DOCUMENTS

| | | | | |
|---|---|---|---|---|
| 5,371,765 A | * | 12/1994 | Guilford | 375/373 |
| 5,673,212 A | * | 9/1997 | Hansen | 708/271 |
| 2008/0069284 A1 | | 3/2008 | Kuhns et al. | |

* cited by examiner

*Primary Examiner* — Ryan Johnson
(74) *Attorney, Agent, or Firm* — Maginot, Moore & Beck (57) ABSTRACT

A method for reducing signal edge jitter in an output signal from a numerically controlled oscillator includes processing an input signal with a first accumulator to provide a first accumulator output signal and continuing to use a carry in the processing of the input signal with the first accumulator in the event of an overflow. The method further includes processing the input signal with a second accumulator to provide a second accumulator output signal and rejecting a carry in the processing of the input signal with the second accumulator in the event of an overflow. The method further includes outputting the second accumulator output signal at an output of the numerically controlled oscillator and synchronizing the second accumulator using the first accumulator output signal.

9 Claims, 4 Drawing Sheets

METHOD AND APPARATUS FOR REDUCING SIGNAL EDGE JITTER IN AN OUTPUT SIGNAL FROM A NUMERICALLY CONTROLLED OSCILLATOR

This application claims priority under 35 U.S.C. §119 to German patent application no. 10 2011 003 738.1, filed on Feb. 8, 2011 in Germany, the disclosure of which is incorporated herein by reference in its entirety.

BACKGROUND

The present disclosure relates to a method and an apparatus as well as a computer program product for reducing signal edge jitter in an output signal from a numerically controlled oscillator.

Oscillators are used in many areas of signal processing. The use of numerically controlled oscillators has advanced as a result of the dissemination of binary digital information. Since binary signals do not contain any intermediate states between the two signal states, a realistic representation of analog signals can be achieved only using a suitably high sampling rate. The sampling rate is controlled using a resonant frequency of an excitable system which is capable of oscillation, such as a micromechanical oscillator or a ring oscillator. For this purpose, it is usually necessary to reduce the resonant frequency to a lower frequency.

When reducing the input frequency to the desired output frequency, undesirable side effects may result in signal interference. If the ratio of input frequency to output frequency is not an integer ratio, the output frequency may be output with edge fluctuation. This then results in phase noise, so-called jitter.

Phase locked loops (also referred to as PLLs), in particular, are widely used in telecommunications, control technology and metrology. Typical application examples are the (de)modulation of signals, clock recovery and the automatic tracking of the PLL output frequency in synchronism with an input signal of variable frequency which is noisy under certain circumstances. The latter is also used in the field of sensor systems, for example in micromechanical oscillators or rate-of-rotation sensors. The processing clock of the evaluation electronics is derived from the fundamental of the micromechanical oscillator or rate-of-rotation sensor using a PLL. As a result, filters and control circuits can be efficiently designed. In integrated circuits, purely digital PLLs allow particularly space-efficient implementations. The phase detector, loop filter and numerically controlled oscillator (NCO) are constructed from digital logic blocks. A crystal oscillator or a ring oscillator integrated in the circuit, for example, generates the basic clock $f_{osc}$ of the NCO.

One or more accumulators, which sum(s) a counter increment (dependent on the phase error, for example), can be used as the numerically controlled oscillator (NCO). If a predefined threshold value is exceeded, the counter overflows and starts the summation from the beginning. A counter run represents a clock period at the output of the NCO. Since the threshold value is generally not an integer multiple of the counter increment, a remainder is produced in the event of overflow, which remainder is concomitantly adopted or concomitantly taken into account in the next run in the case of an accumulator which continues to use the carry. The output clock of the PLL (called the system clock below) is thus on average only coupled to the input signal. The length of the individual clock periods may vary by $1/f_{osc}$, which is referred to as phase jitter.

US 2008/0069284 A1 describes a method for smoothing an output signal from a numerically controlled oscillator. In this case, a phase error of the output signal is determined and is reduced in a controllable delay module in order to obtain a smoothed output signal.

SUMMARY

Against this background, the present disclosure presents a method and also an apparatus which uses this method and finally a corresponding computer program product. Advantageous refinements emerge from the following description.

The present disclosure provides a method for reducing signal edge jitter in an output signal from a numerically controlled oscillator, the method having the following steps: a first accumulator which is designed to process an input signal provides a first accumulator output signal, the first accumulator continuing to use a carry in the event of an overflow, and a second accumulator which is designed to process the input signal provides a second accumulator output signal, the second accumulator rejecting a carry in the event of an overflow;

the second accumulator output signal is output at an output of the numerically controlled oscillator; and the second accumulator is synchronized using the first accumulator output signal.

The present disclosure also provides a method for controlling a phase locked loop, the method having the steps of the method described above and a step in which the signal output at the output of the numerically controlled oscillator is coupled to the input signal.

The present disclosure also provides an apparatus for reducing signal edge jitter in an output signal from a numerically controlled oscillator, the apparatus having the following features:

a first accumulator which is designed to continue to use a carry in the event of an overflow, the first accumulator being designed to provide a first accumulator output signal at an output using an input signal;

a second accumulator which is designed not to continue to use a carry in the event of an overflow, the second accumulator being designed to provide a second accumulator output signal at an output using the input signal; and a device for synchronizing the second accumulator with the first accumulator.

The present disclosure also provides a phase locked loop having the following features:

a device for comparing the phase of an input signal with the phase of a feedback signal;

a device for filtering a compared input signal;

a numerically controlled oscillator having an apparatus described above; and a device for feeding back the output signal from the apparatus described above to the phase comparison device.

The present disclosure also provides a rate-of-rotation sensor which is designed to determine a rate of rotation using an apparatus described above.

In the present case, an apparatus can be understood as meaning an electrical device which processes sensor signals and outputs control or clock signals on the basis of said sensor signals. The apparatus may have at least one interface which may be designed using hardware and/or software. In the case of a hardware design, the interfaces may be, for example, part of a so-called system ASIC which comprises a wide variety of functions of the apparatus. However, it is also possible for the interfaces to be separate, integrated circuits or to at least partially consist of discrete components. In the case of a software design, the interfaces may be software modules which are present, for example, in a microcontroller in addition to other software modules.

A computer program product having program code, which is stored on a machine-readable carrier, such as a semiconductor memory, a hard disk memory or an optical memory, and is used to carry out the method according to one of the embodiments described above when the program is executed on a control device, is also advantageous.

A numerically controlled oscillator may be a signal generator which sums or integrates an input signal in an accumulator in response to an oscillator clock, for example from an electromechanical microoscillator such as a crystal oscillator. The value of the input signal can be used to directly influence a pulse repetition rate of an output signal from the numerically controlled oscillator. Since the accumulator adds the represented value of the input signal to a value already stored in the accumulator in response to a pulse of the oscillator clock, the value in the accumulator increases with each clock cycle. In the clock cycle in which the value exceeds a predefined threshold value, the accumulator overflows and the value in the accumulator is reset to a predetermined initial value. The initial value may be zero. When the overflow occurs, the value in the accumulator is generally greater than the threshold value. The extent to which the predefined threshold value is exceeded is referred to as the carry and can be added to the initial value of the relevant accumulator in the case of an accumulator which processes the carry further for the next oscillator clock cycle.

In the case of an accumulator which does not process the carry further, the carry is generally rejected, that is to say such an accumulator always starts at the initial value of zero. The intervals between two successive instances in which the threshold value is exceeded, the overflows, represent an output clock of such an accumulator output signal. An accumulator with a carry can completely reproduce the information in the input signal, in which case no part of the input signal is lost. As a result, the accumulator which continues to use or processes the carry further has a variation in the lengths of the (clock) intervals. This effect can be characterized as phase jitter. For that reason, the output signal can correspond to information content of the input signal, averaged over a plurality of intervals, without errors. An accumulator which does not process the carry further can reproduce the information in the input signal only incompletely. Part of the input signal may be lost by rejecting the carry. Since the addition in the accumulator always begins with the initial value, the resultant intervals between the overflows are the same as long as the input signal represents a constant value. As a result of the loss of part of the information in the input signal, the accumulator output signal can lead by the rejected carry. In this case, the predefined tolerance range may correspond to the distance between two signal edges of the oscillator clock. If the input signal represents a frequency with an integer multiple of the oscillator clock, no carry is produced and the output signals from an accumulator which continues to use a carry and from an accumulator which does not continue to use a carry are identical. Coupling the signal from the second accumulator to the signal from the first accumulator makes it possible for the second accumulator to likewise completely reproduce the information in the input signal, or the phase angle of the second accumulator output signal can at least be corrected. The phase angle and frequency of the two signals are identical during synchronization.

The present disclosure is based on the knowledge that phase jitter can be effectively prevented by using a device for synchronizing the first accumulator with the second accumulator. In this case, it is possible to use the fact that the phase jitter can be kept very low at particular times and the output signal from the numerically controlled oscillator is nevertheless in a particular ratio to an input signal of this numerical oscillator.

A considerable advantage of the approach presented here is the considerable reduction in the noise caused by the phase jitter. This makes it possible to implement, for example, a sensor control circuit based on a purely digital PLL. This simplifies the circuit design to the effect that it can be designed in a purely digital manner, that is to say without analog filters or oscillators controlled in an analog manner, increases the flexibility since subsequent changes to the filter/controller parameters are possible in a simpler manner, for example, and results in a lower area requirement of integrated circuits. In addition, digital circuits have better area-scaling effects in new process technologies.

If the absence of signal edge jitter is more relevant in predetermined clock cycles in an output signal from a numerically controlled oscillator than in other clock cycles of the output signal, a uniform distance between the pulses of the signal at the output of the numerically controlled oscillator can be achieved by changing over the output of the numerically controlled oscillator to the accumulator output signal from the accumulator, which does not process the carry further, during these predetermined clock cycles. On average, this makes it possible to reduce the phase jitter in the output signal.

A phase locked loop can adapt the output signal from a numerically controlled oscillator to a frequency and phase of an input signal of the phase locked loop by changing the input signal of the NCO. Control may be effected by feeding back the output signal from the NCOs to the input signal of the phase locked loop via an optional frequency divider. In this respect, a phase comparison of the two signals may result in the input signal of the NCO. The input signal may likewise be optionally filtered.

A rate-of-rotation sensor may be a device for determining a rate of rotation of this device and/or of a part permanently connected to it. The rate of rotation provides information on a speed of a rotation of the part. The rate of rotation may be determined by determining gyroscopic forces at a rotatable element of the sensor. In this respect, counterforces of the same magnitude may counteract the gyroscopic forces. A signal from the rate-of-rotation sensor may represent a measure of the counterforces needed to compensate for the gyroscopic forces.

According to another embodiment of the present disclosure, the synchronization step can be cyclically carried out in response to a predeterminable clocking scheme. A predeterminable clocking scheme may be a defined number of changes in the signal level. This makes it possible, on average, to couple the second accumulator output signal to the first accumulator output signal.

According to another embodiment of the present disclosure, the method also comprises a step of changing over the output of the numerically controlled oscillator in order to output the first accumulator output signal at the output of the numerically controlled oscillator. In clock cycles with a particularly high information content, this makes it possible to ensure that the output signal from the first accumulator is transmitted without loss.

Furthermore, the changing-over step can also be cyclically carried out in response to a predeterminable time scheme. As a result, the output signal from the numerically controlled oscillator on average can completely reproduce the information in the input signal before the changing-over operation and can have no phase jitter or signal edge jitter or only very little phase jitter or signal edge jitter after the changing-over operation. If it is no longer necessary to avoid phase jitter, the output of the numerically controlled oscillator can be switched back to the first accumulator output signal again.

Furthermore, the first and second accumulator output signals can also be synchronized in the synchronization step if the first accumulator output signal has run through a predeterminable number of clock cycles, the second accumulator output signal running through a holding phase, without the provision of clock cycles, after the provision of the predeterminable number of clock cycles until synchronization. As a result, the number of clock cycles of the two output signals corresponds. A run-through time of the two output signals for running through the predetermined number of clock cycles likewise corresponds, the second accumulator output signal having a pause at the end of a clocking scheme.

According to another embodiment of the present disclosure, the first and second accumulator output signals can be synchronized in the synchronization step if the output of the numerically controlled oscillator is connected to the output of the first accumulator. This makes it possible to provide the output signal from the numerically controlled oscillator without interruption. During synchronization, the output signal has jitter, whereas, in periods of time in which a changeover to the second accumulator has been carried out, the signal does not have any jitter and leads the accumulator output signal from the first accumulator.

According to another embodiment of the present disclosure, the method also comprises a step of switching back the output of the numerically controlled oscillator in order to output the second accumulator output signal at the output of the numerically controlled oscillator, the switching-back step being cyclically carried out in response to a predeterminable time scheme. As a result, after changing over the output to the first signal, it is possible to change to the second signal again and to output a jitter-free signal in clock cycles of a scheme which are particularly sensitive to jitter.

In another embodiment, synchronization of the first and second accumulator output signals in the synchronization step can be interrupted if the output of the numerically controlled oscillator is connected to the output of the second accumulator. Such an embodiment of the present disclosure provides the advantage that there is an at least short phase with very little phase jitter which is precisely possible, for example, for revertively controlling the phase locked loop or an apparatus which uses the output signal from the numerically controlled oscillator. This makes it possible to use a purely digital PLL circuit, which considerably reduces the costs of producing an apparatus for carrying out the method.

BRIEF DESCRIPTION OF THE DRAWINGS

The disclosure is explained in more detail by way of example using the accompanying drawings, in which.

DETAILED DESCRIPTION

Identical or similar elements may be provided with identical or similar reference symbols in the figures, in which case a repeated description is dispensed with. The figures of the drawings, the description of the latter and the claims also contain numerous features in combination. In this case, it is clear to a person skilled in the art that these features can also be considered individually or can be combined to form further combinations which are not explicitly described here. Furthermore, the disclosure is possibly explained in the following description using different measurements and dimensions, in which case the disclosure should not be understood as being restricted to these measurements and dimensions. Furthermore, method steps according to the disclosure may be repeatedly carried out in a sequence other than the described sequence. If an exemplary embodiment comprises an "and/or" conjunction between a first feature/step and a second feature/step, this can be read such that the exemplary embodiment has both the first feature/step and the second feature/step according to one embodiment and has either only the first feature/step or only the second feature/step according to another embodiment.

In comparison with analog voltage-controlled or current-controlled oscillators (VCO, CCO), the NCO has more or less phase jitter depending on oversampling. With the transition to time-continuous systems such as a sensor element, the variable clock period associated with the phase jitter has an adverse effect on the noise under certain circumstances. Electromechanical delta/sigma converters for revertively controlling the position of a rate-of-rotation sensor are a specific application. In the case of the time-discrete switched-capacitor front-end circuits which are preferably used, the measuring phase and the revertive control phase are temporally separated in a clocking scheme in order to minimize interfering influences caused by electrical crosstalk, for example. For low noise and stable operation of the delta/sigma converter, it is advantageous if no phase jitter occurs, particularly during the revertive control phase. In order to achieve this, an approach which is intended to minimize the phase noise as far as possible is proposed below.

Figure 1:
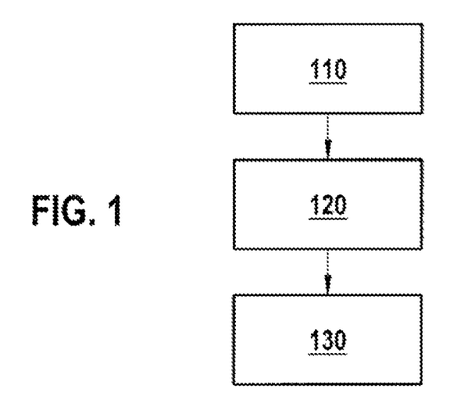
FIG. 1 shows a flowchart of a first exemplary embodiment of the present disclosure as a method.

FIG. 1 shows a flowchart of an exemplary embodiment of a method according to the disclosure for reducing signal edge jitter in an output signal from a numerically controlled oscillator. The method has a first providing step 110 in which a first output signal from a first accumulator is provided. The first accumulator processes an input signal and an oscillator clock. The input signal is summed in time with the oscillator clock. The first accumulator operates with a carry, which means that, if the sum exceeds a defined value, the sum is reset and a remainder, which exceeds the defined value, forms the first summand of the new sum. With the reset, a pulse or a signal edge change is provided at the output of the accumulator. In the step 110, a second output signal from a second accumulator is likewise provided. The second accumulator processes the same input signal as the first accumulator and the same oscillator clock. The second accumulator operates without a carry, which means that, if the sum exceeds the defined value, the sum is also reset in this case but the remainder, which exceeds the defined value, is rejected. As a result of the "clipping" and rejection of the remainder, the pulse is provided at the output of the second accumulator at shorter intervals, which represent the remainder, than in the case of the first accumulator. In an output step 120, the accumulator output signal is output at an output of the numerically controlled oscillator. In a changeover step 130, the output of the numerically controlled oscillator is changed over from the output signal from the first accumulator to the output signal from the second accumulator in order to output the second accumulator output signal at the output of the numerically controlled oscillator.

According to the approach proposed here, the NCO jitter is, in principle, allowed since it usually does not interfere. The resultant consequence is that, as far as possible, no jitter should occur during the feedback phase of the rate-of-rotation sensor. For the respective clock cycles of the feedback phase, a change is made from the frequency-synchronous signal based on the sensor element to a clock defined by the ASIC oscillator. In a first approximation, the clock corresponds to the drive frequency, but not exactly; for that reason, the clock does not have any jitter owing to the NCO accumulator. This clock always runs somewhat faster in order, with a subsequently somewhat longer clock cycle, to make up for the frequency mismatch again and synchronize both clocks.

As a result, the phases inherent in NCOs and the clock period jitter are eliminated in the clocking scheme for particular clock cycles, for instance during the revertive control phase. Nevertheless, it is ensured that the middle clock period is variably coupled to the sensor frequency. An important aspect of the disclosure is an embodiment variant of an NCO which, like in the conventional sense, generates a clock as a multiple of the sensor oscillation frequency but excludes the occurrence of variable clock periods during particular clock cycles. The NCO would then behave (almost) like a VCO.

In principle, the phase jitter could also be counteracted by increased oversampling (that is to say a ratio of the crystal/ring oscillator clock to the system clock). However, process limits and the increased power consumption as a result of the faster running NCO are the significant restrictions with such a procedure. The NCO variant proposed here manages with little oversampling. It is dependent on the number of clock cycles with a fixed clock period in the clocking scheme.

Figure 2:
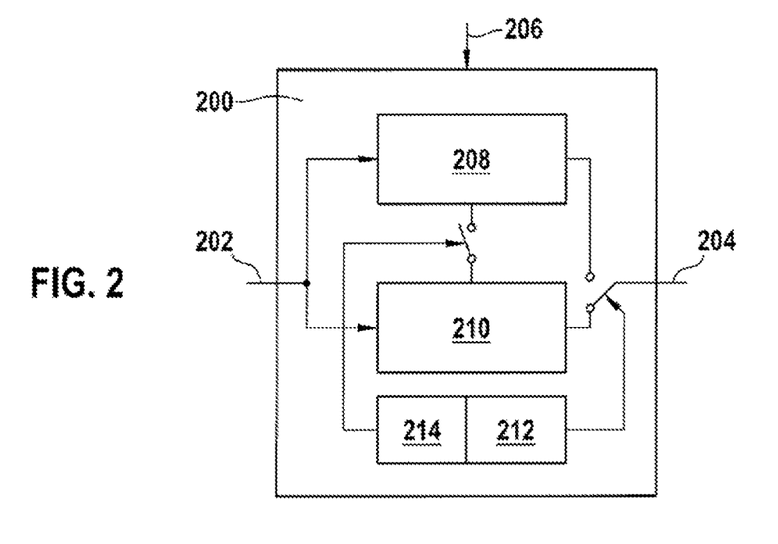
FIG. 2 shows a block diagram of an apparatus according to an exemplary embodiment of the present disclosure.

FIG. 2 shows an exemplary embodiment of an apparatus for reducing signal edge jitter in an output signal from a numerically controlled oscillator NCO according to the present disclosure. A numerically controlled oscillator 200 has an input 202 and an output 204. The numerically controlled oscillator 200 is designed to receive an input signal at the input 202. The numerically controlled oscillator 200 is designed to provide an output signal or a system clock at the output 204. The numerically controlled oscillator 200 also has an input for an oscillator clock 206. The oscillator 200 contains two accumulators 208 and 210. Both accumulators 208 and 210 each have an input which is connected to the input 202. Both accumulators 208 and 210 likewise have an output, one of the outputs being able to be connected to the output 204. In order to respectively connect only one of the outputs of the accumulators 208 and 210 to the output 204, the oscillator 200 has a changeover device 212. The changeover device 212 operates a changeover switch which can respectively contact-connect one of the outputs to the output 204. Since the second accumulator 210 operates without a carry, its accumulator output signal has a higher output frequency than the first accumulator 208. Therefore, the second accumulator 210 can be synchronized with the first accumulator 208 by means of a synchronization device 214 (Sync). The synchronization device 214 can operate a switchable synchronization line. If the second accumulator 210 is connected to the first accumulator 208 by means of the synchronization device 214, the first accumulator 208 forcibly impresses its signal on the second accumulator 210. The two accumulators 208 and 210 are thus in sync. The first accumulator 208 operates with a carry. This means that a modulo, that is to say a remainder of a sum above a predeterminable threshold value, forms the initial value or first summand of a new sum for a subsequent clock cycle. As a result, the accumulator 208 can follow the input signal at the input 202, averaged over a plurality of summation cycles. The devices 212 and 214 can be combined under the term of a clocking scheme monitoring unit.

Figure 3:
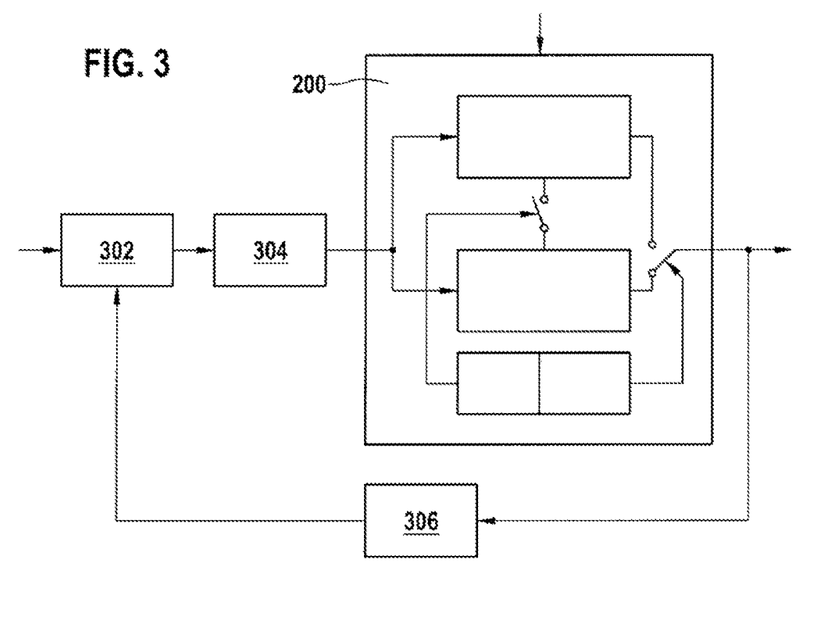
FIG. 3 shows a block diagram of a phase locked loop having an apparatus according to an exemplary embodiment of the present disclosure.

FIG. 3 shows a block diagram of a phase locked loop (PLL). The PLL has a phase detector 302, a loop filter 304, an apparatus 200 according to the approach presented here and a frequency divider 306. The phase detector 302 compares an input signal or a reference clock with a feedback signal which is fed back by the frequency divider 306 from the output of the apparatus 200 via a feedback line. The phase detector 302 provides a phase difference signal. The phase difference signal passes through a loop filter 304 and arrives at the apparatus 200 as an input signal. The apparatus 200 corresponds, in terms of its structure and function, to the apparatus 200 from FIG. 2. The phase locked loop outputs an output signal or a system clock.

In other words, a reference clock of a sensor element, which can use the phase locked loop according to the illustration from FIG. 3, can be compared with the divided system clock of the NCO output in the phase detector. The counter increment for the NCO is generated via the loop filter on the basis of the phase error of the two clock signals. The basic clock of the NCO is provided via an oscillator (for example crystal or ring oscillator). Clock monitoring ensures the position at which the NCO is located in the clocking scheme. Outside the revertive control phase, the freely running NCO clock is generated by the "accumulator with a carry" 208. The "accumulator without a carry" 210 which runs in parallel is meanwhile continuously synchronized with the first accumulator. Synchronization is interrupted only during the revertive control phase. The output 204 of the NCO 200 is changed over to the "accumulator without a carry" 210. The variation in the clock period is thus suppressed during the revertive control phase.

Alternatively, the feedback can be derived using a fixed counter which directly obtains its clock from the oscillator. In this case, the counter is started at the beginning of the feedback clock and feedback is stopped when the maximum value is reached. In this case, it should be ensured that the maximum value is still within the feedback clock when the maximum value is reached under all process uncertainties.

Figure 4:
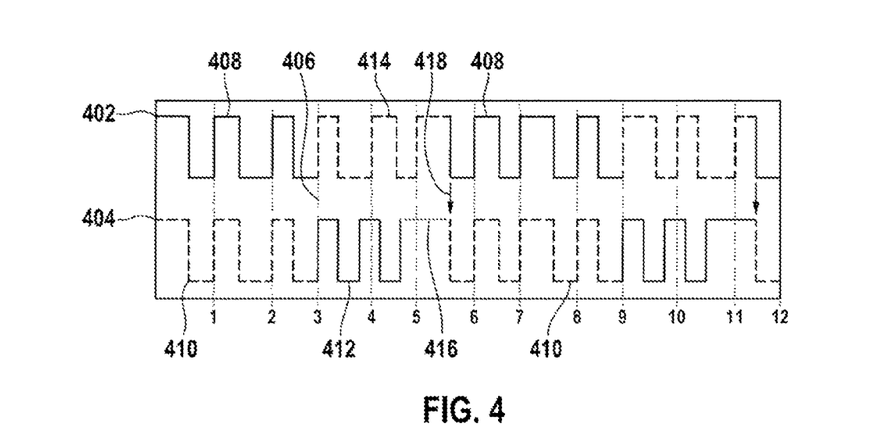
FIG. 4 shows a graph of signal profiles of the first and second accumulator output signals according to an exemplary embodiment of the present disclosure.

FIG. 4 shows a graph with two curves. A first curve 402 represents an accumulator output signal from the first accumulator 208 from FIG. 2. A second curve 404 represents an accumulator output signal from the second accumulator 210 from FIG. 2. Both curves 402 and 404 are arranged above one another, and the consecutive clock cycle numbers of the upper signal are represented by vertical auxiliary lines 406. The abscissa of the graph represents a continuous time; the consecutive clock cycle numbers of the curve 402 are plotted on the abscissa in this case. The ordinate of the graph represents a respective signal state for both curves 402 and 404. The signals can assume only two states, that is to say they are binary. The profiles of the two curves 402 and 404 are respectively different. A solid line represents parts of the signal which are applied to the output of the numerically controlled oscillator from FIG. 2. A dashed line represents parts of the signal which are not applied to the output of the oscillator. A dotted line represents a holding phase in the signal that is likewise applied to the output. The upper curve 402 represents the temporal profile of the output signal from the first accumulator. In a section 408 of the curve 402, the signal from the accumulator with a carry is output. The signal profile has jitter. This means that the distances between the vertical signal edges are irregular. The curve in the section 408 is represented using a solid line. In a section 410 of the curve 404, the second accumulator is synchronized with the first accumulator. Therefore, the signal from the second accumulator is identical to the signal from the first accumulator in the section 410. In the section 410, the signal from the second accumulator is not applied to the output of the oscillator and so the curve is represented using a dashed line in the section 410. Optionally, the signal from the second accumulator can also be output as an output signal since the signals 404 and 402 are identical.

In a section 412 of the curve 404, the second accumulator is not synchronized with the first accumulator. The signal from the accumulator without a carry is output. The signal profile in the section 412 has regular distances between the vertical signal edges. The signal is jitter-free. The signal in the section 412 is applied to the output of the oscillator and the line is represented using a solid line. Between the section 408 and the section 412, the signal path has been changed over from the output of the first oscillator to the output of the second oscillator in this illustration. In a section 414, the signal profile of the curve 402 complies with the same requirements as in the section 408. However, the signal in the section 414 is not applied to the output of the oscillator. Therefore, the signal is represented using a dashed line. In a section 416 of the curve 404, the signal from the second accumulator remains in a holding phase and is therefore represented using a dotted line until, in response to the time 418 in the curve 404, the signal from the second accumulator is again synchronized with the signal in the curve 402.

After an end of the section 416, the output of the numerically controlled oscillator is again changed over to the output of the first accumulator and thus to a second section 408 in this illustration. The second section 408 is again represented using a solid line. This sequence of sections takes place cyclically. In the signal 402, a section 408 is followed by a section 414 and then by a section 408 again. In the signal 404, a section 410 is followed by a section 412, then by a section 416 and then by a section 410 again.

In other words, FIG. 4 illustrates, by way of example, an output clock signal of a freely running NCO clock (system clock, free running clock, 402) in the upper region and a clock of an NCO which is free of phase jitter during the revertive control phase in the lower region. The variable period length can be seen. It is assumed that a clocking scheme consists of 6 individual clock cycles and that revertive control takes place in the clock cycles (clock number) 4 and 5.

In order to suppress the phase jitter during revertive control, it is now possible to use a second NCO (controlled clock, 404) which runs in parallel and ensures, during the clock cycles 4 and 5, that the counter increment is mapped only in integer form in the counting range of the accumulator. The remainder is rejected. The clock period is thus prematurely concluded. It is thus ensured that the revertive control clock cycles always have the shorter clock periods. At the end of the revertive control phase, the second NCO is synchronized again with the first, freely running NCO (Sync, 418). A system clock as a multiple of the sensor resonance is thus guaranteed on average. The dotted clock cycle 416 of the signal 404 is output. The synchronization of the signals 402 and 404 is also active during the clock cycles 1-3 and 7-9 (switch 214 in FIG. 2 closed). Alternatively, only signal 404 can thus also be completely output and it is possible to dispense with a changing-over operation (switch 212 in FIG. 2). The synchronization should then begin at the end of clock cycle 5.

Figure 5:
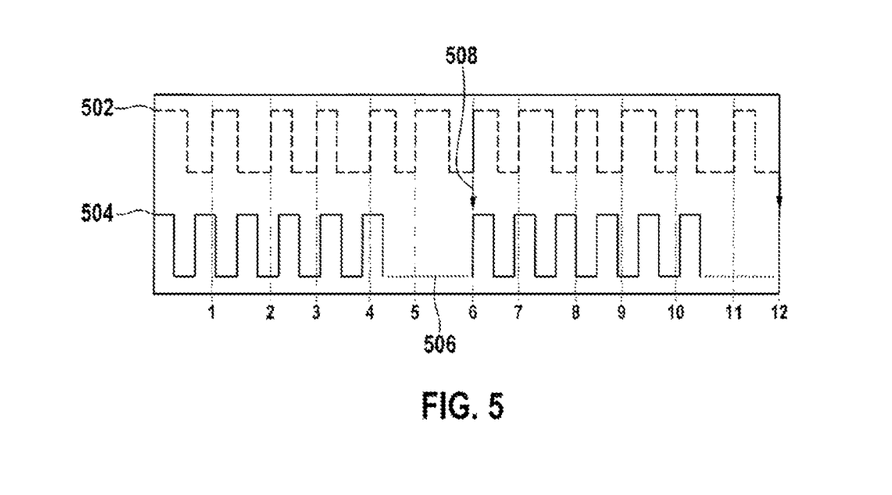
FIG. 5 shows a graph of signal profiles of the first and second accumulator output signals according to another exemplary embodiment of the present disclosure.

FIG. 5 shows another exemplary embodiment of the present disclosure. The clocking scheme can be modified in such a manner that the jitter-free higher-frequency signal 504 is output during the entire basic period (clock cycles 1-6). A longer synchronization clock cycle 506 is inserted until the synchronization time 508 only in the last clock cycle which is typically a reset or pause clock cycle in which no tasks which are critical for control are carried out. As a result, the signal 504 is in sync with the signal 502 and, on average, in sync with the sensor frequency. The synchronization is carried out with a rising signal edge.

Figure 6:
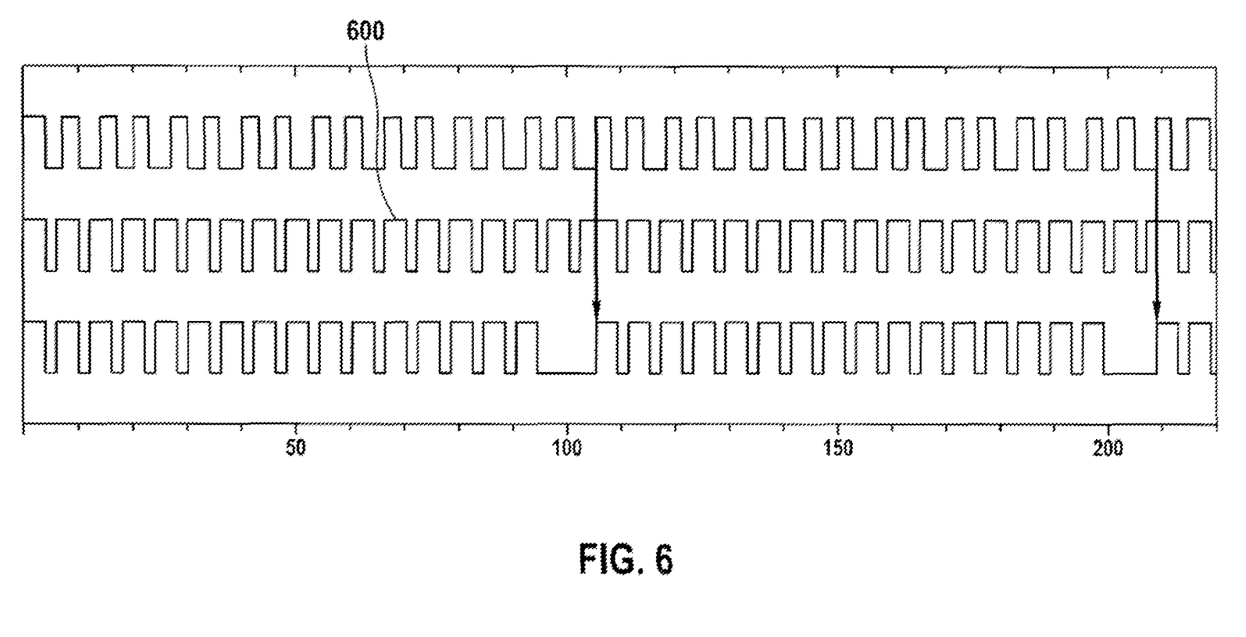
FIG. 6 shows a graph with a different illustration of the exemplary embodiment from FIG. 5.

FIG. 6 shows another illustration of the exemplary embodiment from FIG. 5. In addition to a number of clock cycles, which has been changed to 16, in the clocking schema, another jitter-free signal 600 from an accumulator without a carry is illustrated. The latter oscillates and predefines a frequency. The jitter-free signal 600 is applied to the output over the 16 clock cycles of the clocking scheme. A signal level of the signal applied to the output then remains at a low level and the clocking scheme begins afresh after the reference clock with jitter has likewise completed the 16th clock cycle of the clocking scheme. The signal 600 does not pause but is likewise synchronized again in response to the end of a clocking scheme at the reference clock, that is to say is set to the high signal level and begins to oscillate again.

The use of a purely digital PLL with a ring oscillator is of interest, in particular, for future rate-of-rotation sensors in the automotive and consumer sectors with the aim of reducing the area in the ASIC. The approach presented is not restricted to this application of the rate-of-rotation sensors. Rather, it can be generally applied to control loops which are coupled in a time-continuous/time-discrete manner and measure and revertively control using time-division multiplexing.

What is claimed is:

1. A method for reducing signal edge jitter in an output signal from a numerically controlled oscillator comprising:
    processing an input signal with a first accumulator to provide a first accumulator output signal;
    continuing to use a carry in the processing of the input signal with the first accumulator in the event of an overflow;
    processing the input signal with a second accumulator to provide a second accumulator output signal;
    rejecting a carry in the processing of the input signal with the second accumulator in the event of an overflow;
    outputting the second accumulator output signal at an output of the numerically controlled oscillator; and
    synchronizing the second accumulator using the first accumulator output signal.

2. The method according to claim 1, wherein the synchronizing the second accumulator is carried out in response to a predeterminable clocking scheme.

3. The method according to claim 1, further comprising:
    changing over the output of the numerically controlled oscillator in order to output the first accumulator output signal at the output of the numerically controlled oscillator.

4. The method according to claim 1, wherein:
    the first and second accumulator output signals are synchronized if the first accumulator output signal has run through a predeterminable number of clock cycles, and the second accumulator output signal runs through a holding phase after the predeterminable number of clock cycles until synchronization.

5. The method according to claim 3, further comprising:
switching back the output of the numerically controlled oscillator in order to output the second accumulator output signal at the output of the numerically controlled oscillator,
wherein the switching-back the output is cyclically carried out in response to a predeterminable time scheme.

6. The method according to claim 1, further comprising:
coupling the signal output at the output of the numerically controlled oscillator to the input signal,
wherein the method is for controlling a phase locked loop.

7. An apparatus for reducing signal edge jitter in an output signal from a numerically controlled oscillator comprising:
a first accumulator configured to continue to use a carry in the event of an overflow, the first accumulator further configured to provide a first accumulator output signal using an input signal;
a second accumulator configured to not to continue to use a carry in the event of an overflow, the second accumulator further configured to provide a second accumulator output signal using the input signal; and
a device configured to synchronize an output of the second accumulator with an output of the first accumulator.

8. A phase locked loop comprising:
a device for comparing the phase of a starting signal with the phase of a feedback signal in order to obtain a compared starting signal;
a device for filtering the compared starting signal in order to obtain a filtered starting signal;
a numerically controlled oscillator including (i) a first accumulator configured to continue to use a carry in the event of an overflow, the first accumulator being further configured to provide a first accumulator output signal using an input signal, (ii) a second accumulator which is configured to not use a carry in the event of an overflow, the second accumulator being further configured to provide a second accumulator output signal using the input signal, and (iii) a device for synchronizing an output of the second accumulator with an output of the first accumulator; and
a device for feeding back an output signal from the numerically controlled oscillator to the phase comparison device,
wherein the filtered starting signal is supplied to the numerically controlled oscillator as the input signal, and
wherein the phase locked loop is configured to provide the output signal from the numerically controlled oscillator.

9. The apparatus of claim 7, wherein the apparatus is a component of a rate-of-rotation sensor which is designed to determine a rate of rotation.

* * * * *

UNITED STATES PATENT AND TRADEMARK OFFICE
CERTIFICATE OF CORRECTION

PATENT NO. : 8,775,491 B2  
APPLICATION NO. : 13/367834  
DATED : July 8, 2014  
INVENTOR(S) : Alexander Buhmann et al.

Page 1 of 1

It is certified that error appears in the above-identified patent and that said Letters Patent is hereby corrected as shown below:

In The Claims

In claim 7, line 21, delete the phrase "to continue to" between the words "not" and "use".

Signed and Sealed this
Twenty-eighth Day of June, 2016

Michelle K. Lee
*Director of the United States Patent and Trademark Office*